United States Patent
Park et al.

(10) Patent No.: US 9,730,344 B2
(45) Date of Patent: Aug. 8, 2017

(54) WINDOW MEMBER AND DISPLAY APPARATUS HAVING THE SAME

(71) Applicant: Samsung Display Co., Ltd., Yongin-si, Gyeonggi-do (KR)

(72) Inventors: Jungsoo Park, Asan-si (KR); Kyuhyeong Cheon, Seongnam-si (KR); Minsu Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/252,002

(22) Filed: Aug. 30, 2016

(65) Prior Publication Data

US 2017/0202096 A1 Jul. 13, 2017

(30) Foreign Application Priority Data

Jan. 8, 2016 (KR) .................. 10-2016-0002752

(51) Int. Cl.
| | |
|---|---|
| *H05K 5/02* | (2006.01) |
| *H05K 5/00* | (2006.01) |
| *H05K 7/14* | (2006.01) |
| *G01J 1/04* | (2006.01) |
| *G06F 3/041* | (2006.01) |

(52) U.S. Cl.
CPC .......... *H05K 5/0217* (2013.01); *G01J 1/0407* (2013.01); *H05K 5/0017* (2013.01); *H05K 7/1427* (2013.01); *G06F 3/0412* (2013.01)

(58) Field of Classification Search
CPC ... H05K 5/0217; H05K 5/0239; H05K 5/0243
See application file for complete search history.

(56) References Cited

FOREIGN PATENT DOCUMENTS

| KR | 10-2013-0094500 | 8/2013 |
|---|---|---|
| KR | 10-1523497 B1 | 5/2015 |

*Primary Examiner* — Jeremy C Norris
(74) *Attorney, Agent, or Firm* — Lewis Roca Rothgerber Christie LLP

(57) ABSTRACT

A display apparatus includes: a display panel configured to display an image; a window on the display panel having a transmissive area through which the image is transmitted and a non-transmissive area adjacent to the transmissive area, a case configured to accommodate the display panel and being coupled to the window; and a light sensor accommodated in the case at the non-transmissive area. The window includes a base member and a printed layer, and the base member has a first portion at the non-transmissive area and a second portion extending from the first portion at the transmissive area. The first portion has a curved upper surface and a recess. The printed layer is on a lower surface of the first portion and has an opening corresponding to the light sensor. The recess has a flat bottom surface overlapping the light sensor.

20 Claims, 7 Drawing Sheets

WINDOW MEMBER AND DISPLAY APPARATUS HAVING THE SAME

CROSS-REFERENCE TO RELATED APPLICATION

This U.S. non-provisional patent application claims priority under 35 U.S.C. §119 to and the benefit of Korean Patent Application No. 10-2016-0002752, filed on Jan. 8, 2016 in the Korean Intellectual Property Office, the entire content of which is hereby incorporated by reference.

BACKGROUND

1. Field

Aspects of the present disclosure relate to a window member and a display apparatus having the same.

2. Description of the Related Art

Nowadays, various display apparatuses used in multimedia devices, such as televisions, mobile phones, tablet computers, navigations, and game machines, are being developed.

Recently, display apparatuses having various shapes, different from flat surface display apparatuses, are being developed. For example, various flexible display apparatuses, such as curved display apparatuses, bendable display apparatuses, foldable display apparatuses, rollable display apparatuses, and stretchable display apparatuses, are being developed.

SUMMARY

Embodiments of the present disclosure provide a display apparatus in which occurrences of malfunctions due to a light sensor may be reduced or prevented.

An embodiment of the inventive concept provides a display apparatus including a display panel configured to display an image, a window, a case, and a light sensor.

In an embodiment, the window may be on the display panel and may have a transmissive area through which the image is transmitted and a non-transmissive area adjacent to the transmissive area. The case may accommodate the display panel and be coupled to the window. The light sensor may be accommodated in the case overlapping the non-transmissive area.

In an embodiment, the window may include a base member and a printed layer. The base member may include a first portion and a second portion. The first portion may be at the non-transmissive area, and the second portion may extend from the first portion and be at the transmissive area. The first portion may have a curved upper surface and a recess.

In an embodiment, the printed layer may be on a lower surface of the first portion and may have an opening corresponding to the light sensor.

In an embodiment, the recess may be recessed from the upper surface of the first portion and may have a flat bottom surface overlapping the light sensor.

In an embodiment, the recess may have a side surface extending between the bottom surface and the upper surface of the first portion, and the side surface may be inclined with respect to the bottom surface by an angle. The angle may be in a range of greater than about 0° to less than about 180°.

In an embodiment, a length of a portion of the side surface nearer to the second portion from the bottom surface to the upper surface of the first portion may be greater than a length of another portion of the side surface farther from the second portion from the bottom surface to the upper surface of the first portion.

In an embodiment, the lower surface may be flat. A portion of the base member between the bottom surface of the recess and the lower surface of the first portion may have a uniform thickness. The bottom surface may have an area that is greater than that of the opening.

In an embodiment, the base member may include glass or plastic.

In an embodiment, the light sensor may include a light generator configured to generate light and a light receiver configured to receive the light generated by the light generator. The light may be infrared light.

In another embodiment, the lower surface of the first portion may have a flat surface portion overlapping the light sensor and a curved surface portion extending from the flat surface portion.

In another embodiment, the printed layer may have a plurality of the openings. Adjacent ones of the openings may be spaced from each other. The bottom surface may have an area that is greater than a sum of areas of the openings.

In another embodiment, the printed layer may have a plurality of the recesses, and ones of the recesses may respectively correspond to ones of the openings.

In another embodiment, a bottom surface of each of the recesses may have an area that is greater than that of each of the openings.

In another embodiment, a bottom surface of each of the recesses has an area that is greater than that of corresponding ones of the openings.

BRIEF DESCRIPTION OF THE DRAWINGS

The accompanying drawings are included to provide a further understanding of the inventive concept and are incorporated in and constitute a part of this specification. The drawings illustrate exemplary embodiments of the inventive concept and, together with the description, serve to explain aspects of the inventive concept. In the drawings.

DETAILED DESCRIPTION

Figure 1:
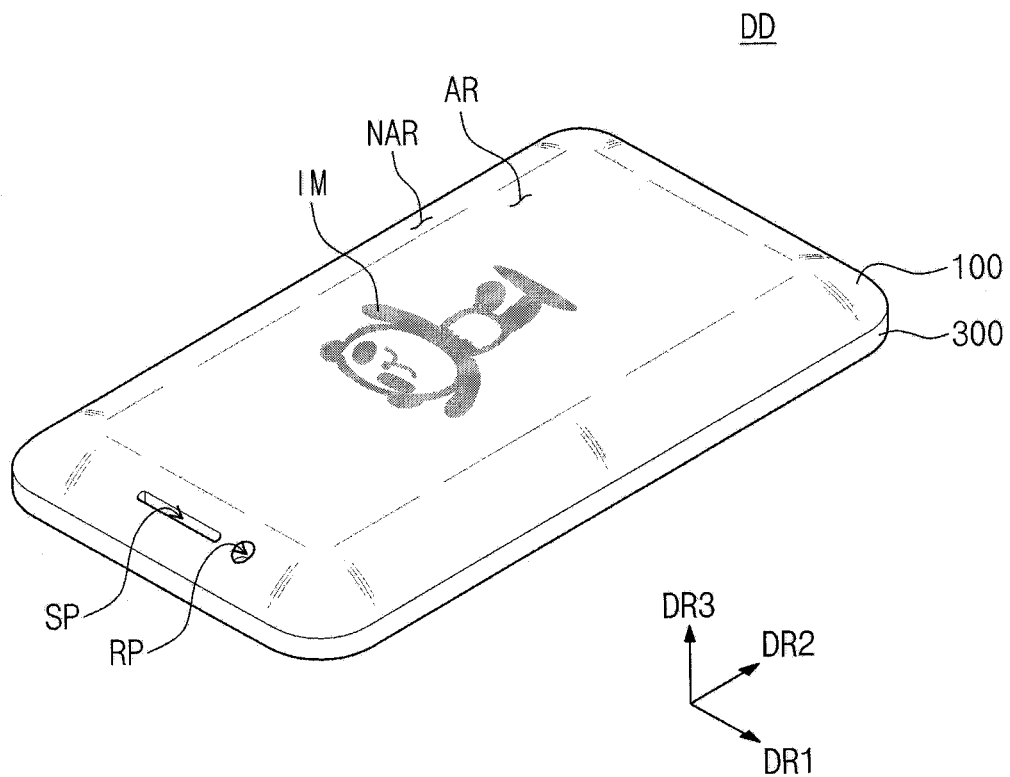
FIG. 1 is a perspective view of a display apparatus according to an embodiment of the inventive concept.

Embodiments of the present invention may be variously changed and executed, and thus, certain embodiments are exemplarily illustrated in the drawings and described in the present disclosure. However, the present invention is not limited to the herein described embodiments, and it should be understood that the present invention includes structural and functional equivalents of the subject matter described herein.

It will be understood that when an element or layer is referred to as being "on," "connected to," or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. §112(a) and 35 U.S.C. §132(a).

Hereinafter, embodiments of the inventive concept will be described in detail with reference to accompanying drawings.

Figure 2:
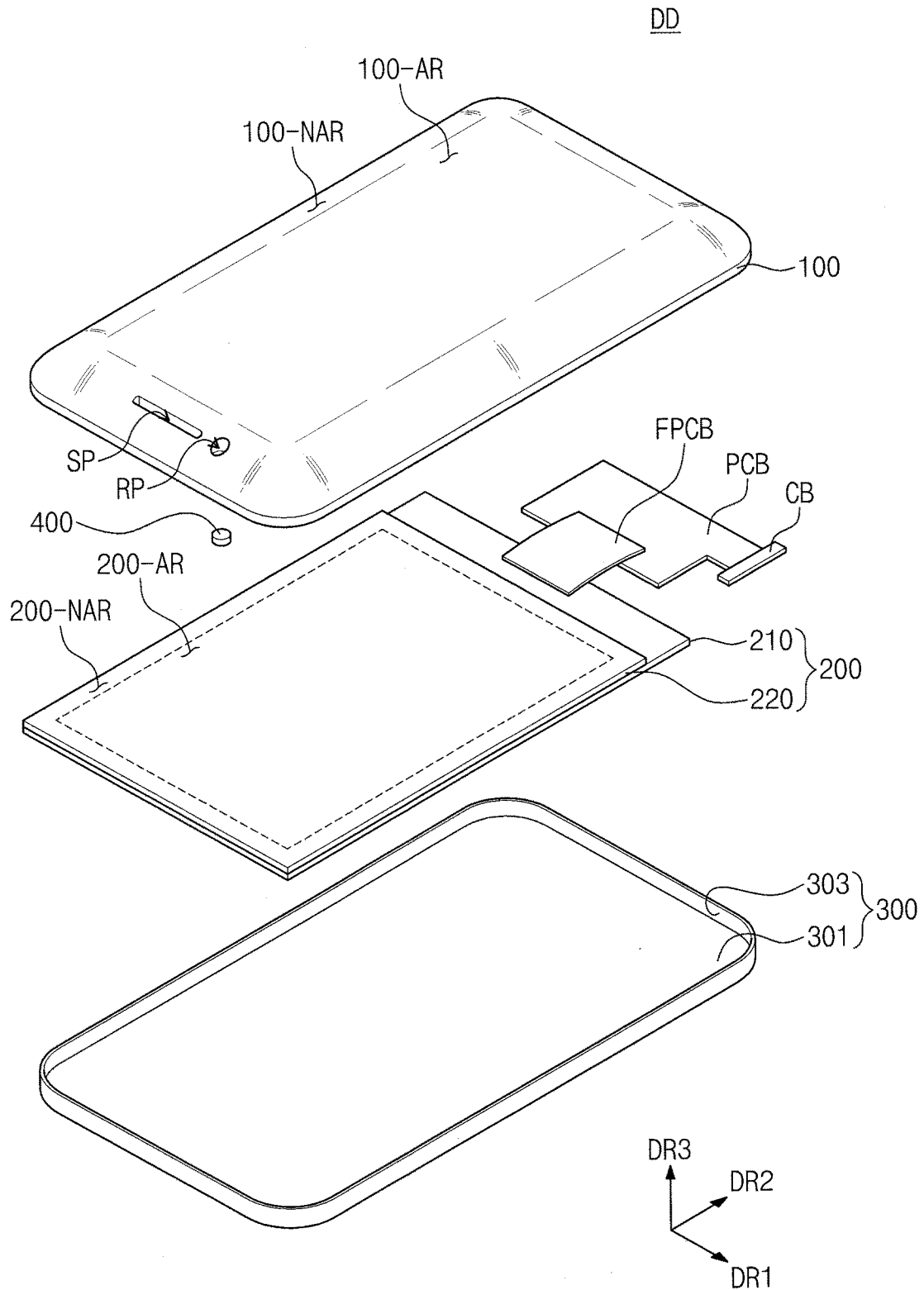
FIG. 2 is an exploded perspective view of the display apparatus shown in FIG. 1.

FIG. 1 is a perspective view of a display apparatus according to an embodiment of the inventive concept, and FIG. 2 is an exploded perspective view of the display apparatus shown in FIG. 1.

In FIG. 1, a portable terminal is illustrated as an example in which a display apparatus DD according to an embodiment of the inventive concept is included. The portable terminal may be a tablet PC, a personal digital assistant (PDA), a portable multimedia player (PMP), a game machine, or a watch-type electronic device. The inventive concept may be applied to large-scale electronic devices, such as televisions and outdoor billboards, and to small- and medium-scale electronic devices, such as personal computers (PCs), laptop computers, vehicle navigation units, and cameras. The above-described electronic devices are provided only for explaining certain exemplary embodiments, and embodiments of the inventive concept may be adapted to other electronic devices without departing from the spirit and scope of the inventive concept.

As illustrated in FIG. 1, the display apparatus DD may include a plurality of areas (portions) sectioned on a display surface thereof. The display apparatus DD may include a display part AR (e.g., a display area) at which an image IM is displayed and a non-display part NAR (e.g., a non-display area) may be defined adjacent to the display part AR. In the presently-described embodiment, for example, the display part AR may have a rectangular shape. The non-display part NAR may surround (e.g., may surround a periphery of) the display part AR.

Referring to FIGS. 1 and 2, the display apparatus DD may include a window member 100 (e.g., a window), a display panel 200, a case member 300 (e.g., a case), and a light sensor 400.

The window member 100 may be disposed on (e.g., over) the display panel 200. The window member 100 may include a transmissive area 100-AR (e.g., a light transmissive part or area) through which the image IM provided from the display panel 200 is transmitted, and a non-transmissive area 100-NAR may be defined adjacent to the transmissive area 100-AR. The transmissive area 100-AR is an area of the window member 100 corresponding to the display area AR of the display apparatus DD, and the non-display area 100-NAR is an area of the window member 100 corresponding to the non-display area NAR of the display apparatus DD.

The window member 100 may include a speaking part SP (e.g., a speaker area or opening) facing (or over) a speaker disposed on the non-transmissive area 100-NAR (e.g., disposed on a portion of the non-transmissive area 100-NAR) and a recess part RP (e.g., a recess or a groove) facing (or over) the light sensor 400. The speaking part SP may include at least one opening (e.g., at least one opening portion) to provide sound outputted from the speaker to a user therethrough. Light outputted from (e.g., generated by) the light sensor 400 may be provided through (e.g., may transmit through) the recess part RP. In one embodiment, some of the provided light may be incident onto the light sensor 400 through the recess part RP (e.g., some of the light outputted from the light sensor 400 may reflect onto the light sensor 400 through the recess part RP). The speaking part SP and the light sensor 400 may be spaced from (e.g., spaced a predetermined distance apart from) each other and may be disposed on an upper end (e.g., an upper surface) of the display apparatus DD.

The display panel 200 may provide (e.g., generate) the image IM. The display panel 200 may include (e.g., may be defined as) a display area 200-AR and a non-display area 200-NAR. The display area 200-AR is an area at which the image IM is displayed and corresponds to the transmissive area 100-AR of the window member 100. The non-display area 200-NAR is adjacent to (e.g., surrounds a periphery of) the display area 200-AR and corresponds to the non-transmissive area 100-NAR of the window member 100.

In an embodiment of the inventive concept, the display panel 200 may be an organic light emitting display panel. However, embodiments are not limited thereto, and aspects of the present invention may be applied to, for example, liquid crystal display panels and the like. The display panel 200 may include a substrate 210, an organic light-emitting element, and a sealing layer 220. The organic light-emitting element is disposed on the substrate 210. The sealing layer 220 is disposed on the substrate 210 to seal the organic light-emitting element from the outside.

The display panel 200 may have a display surface at which the image IM is displayed and a rear surface opposite to the display surface. In FIG. 2, the display surface is defined as a top surface of the sealing layer 230, and the rear surface is defined as a bottom surface of the substrate 210.

The display surface at which the image IM is displayed is parallel with a plane (e.g., a surface) defined by a first direction DR1 and a second direction DR2. A normal line direction of the display surface refers to a third direction DR3. The third direction DR3 is a reference direction for distinguishing a front surface from a rear surface of each member. However, the above-described directions are relative, and the present invention is not limited thereto. For example, the above-described directions may be other directions.

The display apparatus DD may further include a flexible printed circuit board FPCB and a printed circuit board PCB. The flexible printed circuit board FPCB may electrically connect the display panel 200 to the printed circuit board PCB. The flexible printed circuit board FPCB may have one end that is connected to one surface of the substrate 210 exposed by the sealing layer 220 (e.g., connected to a portion of the substrate 210 that is exposed by the sealing layer 220) and another end that is connected to the printed circuit board PCB. The flexible printed circuit board FPCB may be bent downward toward the substrate 210 in a state in which the flexible printed circuit board FPCB is coupled to the substrate 210.

The printed circuit board PCB may output a signal to the display panel 200 through the flexible printed circuit board FPCB and/or may receive a signal from the display panel 200. As the flexible printed circuit board FPCB is bent, the printed circuit board PCB may be attached to a lower portion of the substrate 210 in a state in which the printed circuit board PCB is coupled to the flexible printed circuit board FPCB. A connector CB for receiving a signal from the outside may be connected to the printed circuit board PCB.

The display apparatus DD may further include a touch panel. The touch panel may be disposed between the window member 100 and the display panel 200. However, the touch panel is not limited to the above-described position or arrangement. In another embodiment, the touch panel may be disposed in (e.g., may be integral with) the display panel 200. The touch panel may operate according to a resistive-overlay manner, a capacitive-overlay manner, or an electro-magnetic-induction manner. The touch panel may acquire (or determine) coordinate information of a point at which a touch event occurs.

The case member 300 may be disposed under the display panel 200 to accommodate the display panel 200. The case member 300 may include a bottom part 301 (e.g., a bottom portion) facing the rear surface of the display panel 200 and a side-wall part 303 (e.g., a side wall) bent from the bottom part 301 to extend in the third direction DR3. The bottom part 301 and the side-wall part 303 may define an inner space at which the display panel 200 is accommodated. The case member 300 may be coupled to the window member 100 with the display panel 200 therebetween.

The light sensor 400 may be accommodated in the case member 300 to overlap (e.g., may be under) the recess part RP. The light sensor 400 may provide (e.g., emit) light through the recess part RP and may receive some of the provided light. The display panel 200 may determine whether or not to display the image IM according to whether or not some of (e.g., a certain amount of) the light, which is generated by the light sensor 400, is received by the light sensor 400 by being reflected by an adjacent user after traveling outside the window member 100. In one embodiment, the light generated by the light sensor 400 may be infrared light.

Figure 3:
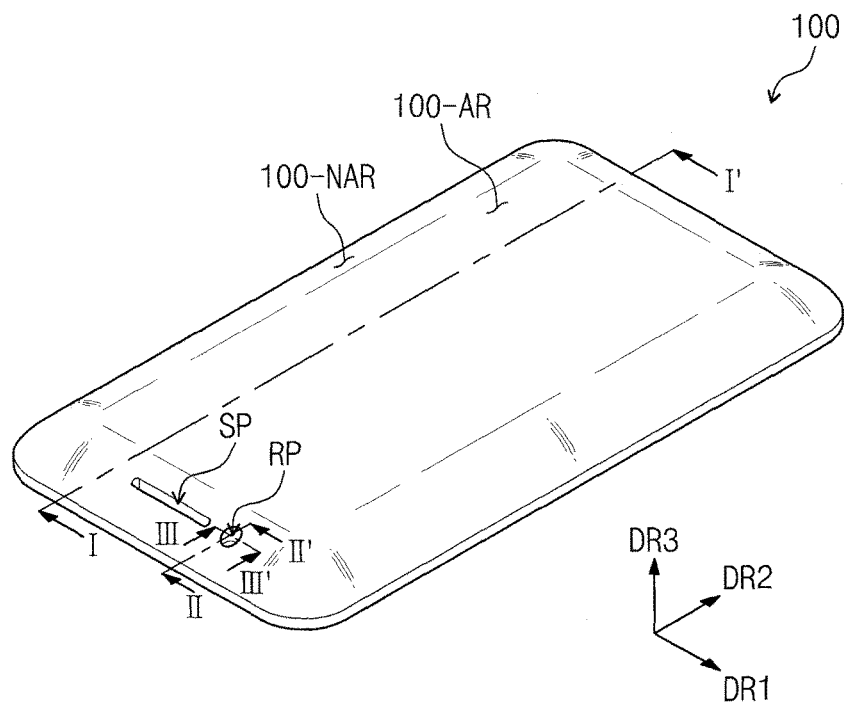
FIG. 3 is a perspective view of a window member according to an embodiment of the inventive concept.
Figure 4:
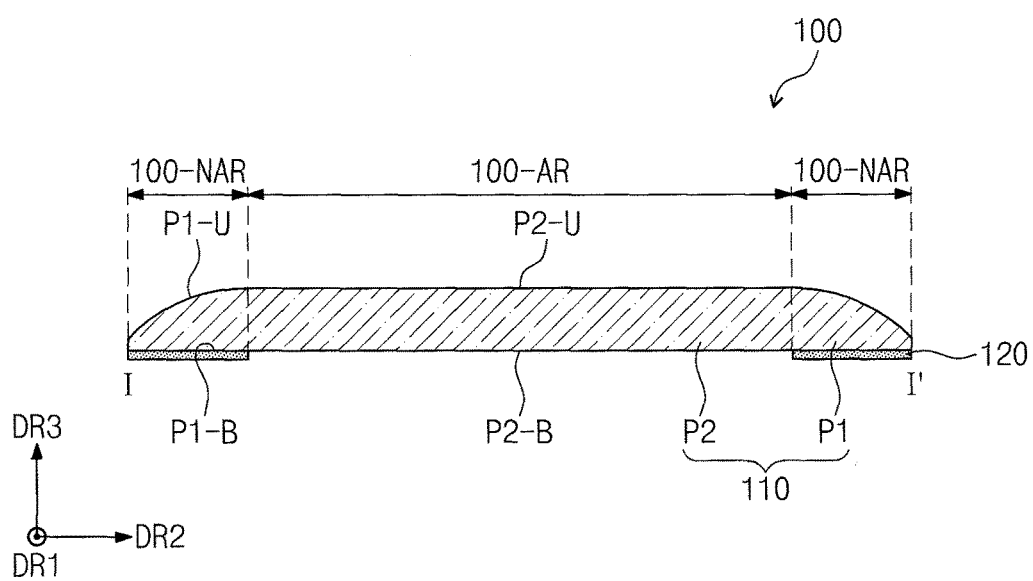
FIG. 4 is a cross-sectional view of the window member taken along the line I-I' of FIG. 3.
Figure 5:
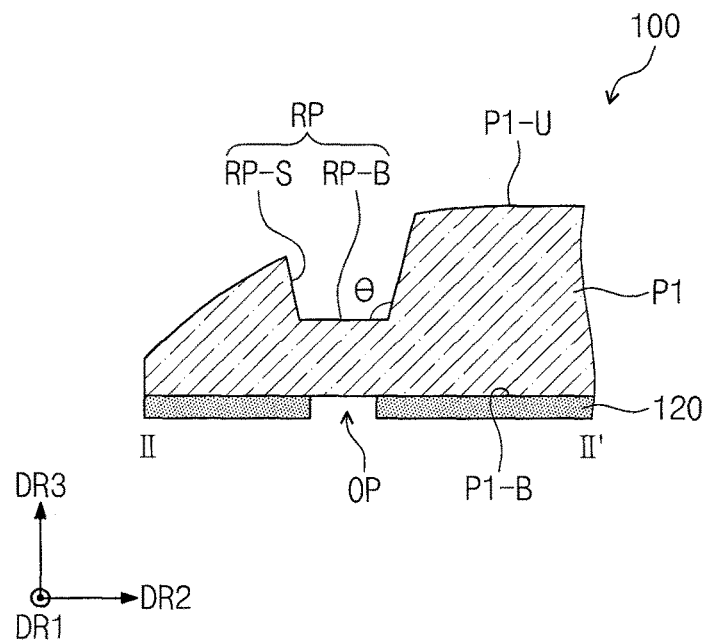
FIG. 5 is a cross-sectional view of the window member taken along the line II-II' of FIG. 3.
Figure 6:
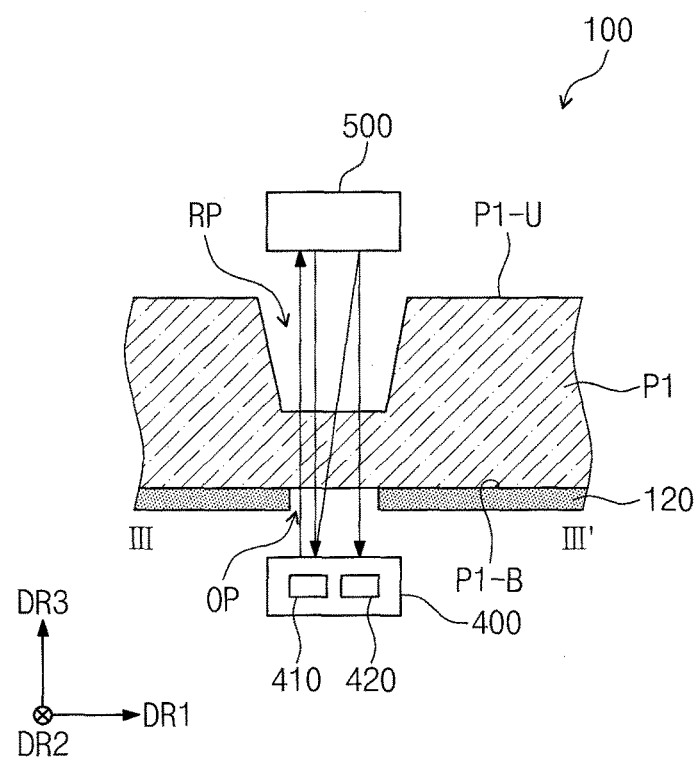
FIG. 6 is a cross-sectional view of the window member taken along the line III-III' of FIG. 3.

Hereinafter, the window member 100 according to an embodiment of the inventive concept will be described with reference to FIGS. 3-6. FIG. 3 is a perspective view of a window member according to an embodiment of the inventive concept. FIG. 4 is a cross-sectional view of the window member taken along the line I-I' of FIG. 3, FIG. 5 is a cross-sectional view of the window member taken along the line II-II' of FIG. 3, and FIG. 6 is a cross-sectional view of the window member taken along the line III-III' of FIG. 3.

Referring to FIGS. 3 and 4, the window member 100 may include a base member 110 (e.g., a base) and a printing layer 120 (e.g., a printed layer). The base member 110 may be formed of glass, sapphire, plastic, or the like.

The base member 110 may include a first part P1 (e.g., a first area) at (or overlapping) the non-transmissive area 100-NAR and a second part P2 (e.g., a second area) connected to (extending from) the first part P1 and at (or overlapping) the transmissive area 100-AR. The second part P2 is surrounded by the first part P1 (e.g., the first part P1 surrounds a periphery of the second part P2).

The first part P1 may include a first upper surface P1-U and a first lower surface P1-B opposite to the first upper surface P1-U. The first lower surface P1-B may be parallel with the plane defined by the first direction DR1 and the second direction DR2. The first lower surface P1-B may be flat or substantially flat. The first part P1 may have a thickness that gradually decreases as the first part P1 extends from (e.g., extends away from) the second part P2. A thickness reduction rate of the first part P1 may gradually increase as the first part P1 extends from the second part P2. The first part P1 may further include the recess part RP recessed from the first upper surface P1-U. The recess part RP will be further described later.

Although the first part P1 corresponding to the non-display area NAR of the display apparatus DD has a curved first upper surface P1-U in the illustrated embodiment, the first upper surface P1-U is not limited to the above-described structure. For example, the first upper surface P1-U of the first part P1 may be flat or substantially flat excluding a portion at which the recess part RP is defined in the first part P1.

The second part P2 may include a second upper surface P2-U connected to (extending from) the first upper surface P1-U and a second lower surface P2-B connected to (extending from) the first lower surface P1-B opposite to the second upper surface P2-U. Each of the second upper surface P2-U and the second lower surface P2-B may be a surface that is parallel with the plane defined by the first and second directions DR1 and DR2. The second part P2 may have a certain thickness (e.g., a predetermined or constant thickness).

The printing layer 120 may correspond to the non-display part NAR of the display apparatus DD and may prevent an inside of the display apparatus DD from being visible from the outside. The printing layer 120 may have a black or white color or may have various colors, such as a chromatic color or a metal color. The printing layer 120 may be disposed on the first lower surface P1-B.

Referring to FIGS. 5 and 6, the printing layer 120 may include an opening portion OP (e.g., an opening or a gap) corresponding to the recess part RP and the light sensor 400.

The recess part RP may be connected to (may extend from) the first upper surface P1-U. The recess part RP may include a flat bottom surface RP-B and a side surface RP-S connecting (extending between) the bottom surface RP-B and the first upper surface P1-U.

In an embodiment of the inventive concept, the bottom surface RP-B may be a surface parallel with the plane defined by the first and second directions DR1 and DR2. The side surface RP-S may be inclined from (with respect to) the bottom surface RP-B by an angle θ (e.g., a predetermined angle). The angle θ may be in a range of greater than about 0° to less than about 180°. In an embodiment of the inventive concept, because the first upper surface P1-U is curved, the length of portions of the side surface RP-S from one edge of the bottom surface RP-B to the first upper surface P1-U may gradually increase along the side surface RP-S from a portion of the side surface RP-S farthest from the second part P2 to other portions of the side surface RP-S nearer to the second part P2.

A portion of the first part P1 between the bottom surface RP-B and the first lower surface P1-B may have a uniform or substantially uniform thickness. The bottom surface RP-B may have an area that is greater than that of the opening portion OP. However, the bottom surface RP-B is not limited to the above-described area. For example, the bottom surface RP-B may have the same area as that of the opening portion OP or may have a larger area than that of the opening portion OP.

As illustrated in FIG. 6, the light sensor 400 may be disposed to overlap (e.g., may be under) the recess part RP. The light sensor 400 may include a light generator 410 (e.g., a light generating part) and a light receiver 420 (e.g., a light receiving part). The light generator 410 and the light receiver 420 may be disposed in the opening portion OP in a plan view. The light generator 410 may emit light from the display apparatus DD to the outside of the window member 100 through the opening portion OP. Some of the light provided by the light generator 410 may be reflected by a user 500 adjacent to the window member 100 and be incident onto the light receiver 420 through the opening portion OP.

The light incident onto the light sensor 400 along various paths may be refracted by a surface of the curved base member 110 at various angles and collected in (e.g., partially absorbed by) the base member 110. Thus, the light sensor 400 may inaccurately detect the light incident thereto, and thus, the display panel may not function properly.

However, because the display apparatus DD according to an embodiment of the inventive concept includes the recess part RP having the flat bottom surface RP-B, the light sensor 400 may accurately detect the light incident thereto even though the light provided from the light sensor 400 is incident onto the light sensor 400 along various paths. Thus, a phenomenon in which the display panel 200 does not function properly may be prevented or an occurrence of a malfunction may be reduced.

Although the recess part RP corresponds to the light generator 410 in an embodiment of the inventive concept, the recess part RP is not limited to the above-described position. For example, the recess part RP may be positioned to correspond to devices operating by using (e.g., devices relying upon) incident light, such as a camera.

Hereinafter, embodiments of the inventive concept will be described with reference to some of the accompanying drawings. For convenience of description, differences between the presently-described and previously-described embodiments are primarily described. Also, elements described above are indicated by the same reference symbols, and repeated description of the above-described elements may be omitted.

Figure 7:
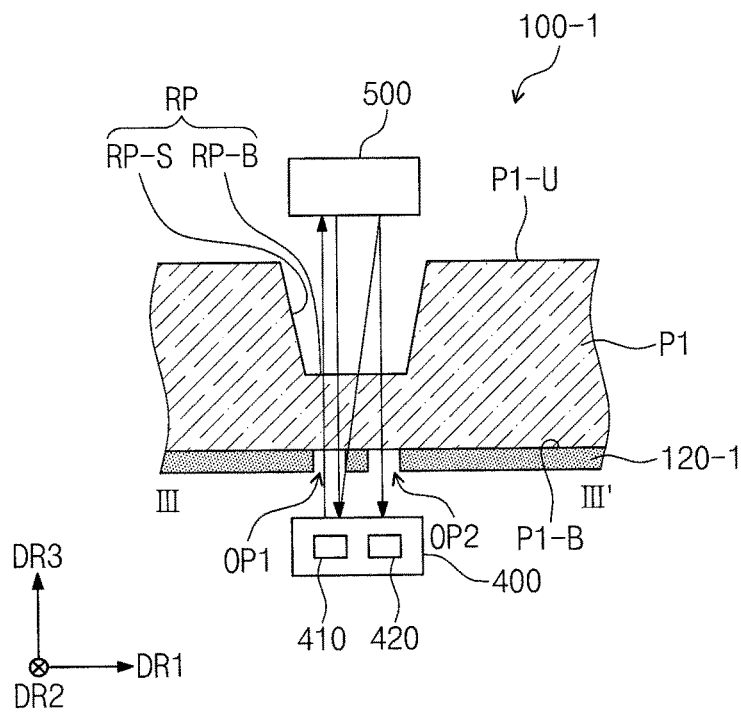
FIG. 7 is a cross-sectional view of a window member according to another embodiment of the inventive concept.

FIG. 7 is a cross-sectional view of a window member taken along the line III-III' according to another embodiment of the inventive concept.

Referring to FIG. 7, a window member 100-1 (e.g., a window) according to another embodiment of the inventive concept may include a printing layer 120-1 (e.g., a printed layer) in which a plurality of opening portions (e.g., a plurality of openings or gaps) are defined. In FIG. 7, the printing layer 120-1 is exemplarily illustrated as including two opening portions, for example, a first opening portion OP1 and a second opening portion OP2. However, the number of opening portions is not limited thereto. The first opening portion OP1 may be spaced from (e.g., spaced apart by a predetermined distance from) the second opening portion OP2.

A recess part RP (e.g., a recess or groove) may overlap the first and second opening portions OP1 and OP2. In a plan view, the first and second opening portions OP1 and OP2 may be defined at a bottom surface RP-B of the recess part RP. For example, the bottom surface RP-B may have an area that is greater than a sum of an area of the first opening portion OP1 and an area of the second opening portion OP2.

The light sensor 400 may provide (e.g., emit) light and/or may receive some of the provided light through the first and second opening portions OP1 and OP2. The light sensor 400 may include the light generator 410 and the light receiver 420. In another embodiment of the inventive concept, the light generator 410 may be disposed at the first opening portion OP1 in a plan view, and the light receiver 420 may be disposed at the second opening portion OP2 in the plan view. However, embodiments are not limited thereto, and positions of the light generator 410 and the light receiver 420 may be modified or switched.

Figure 8:
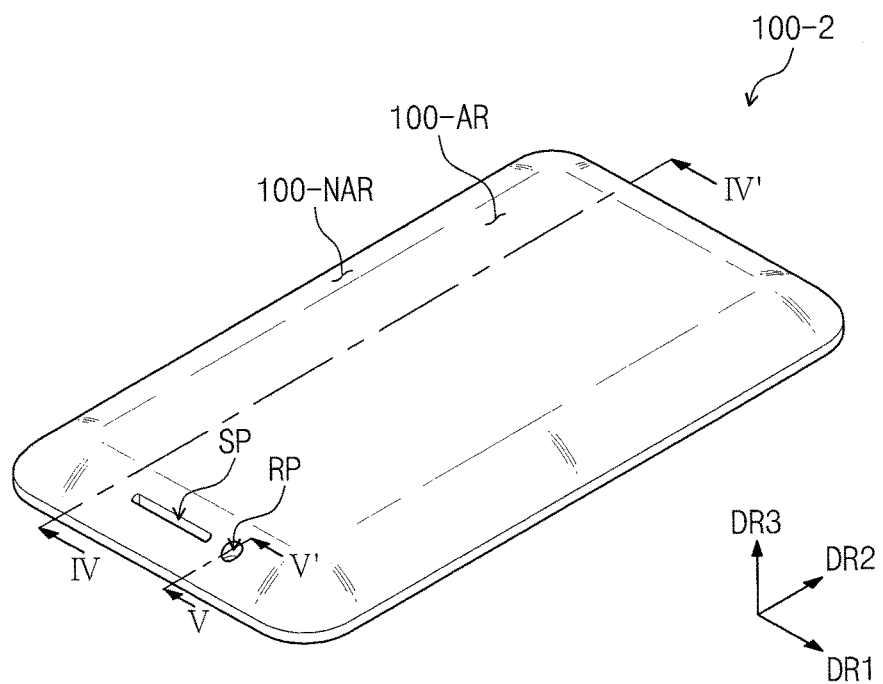
FIG. 8 is a perspective view of a window member according to another embodiment of the inventive concept.
Figure 9:
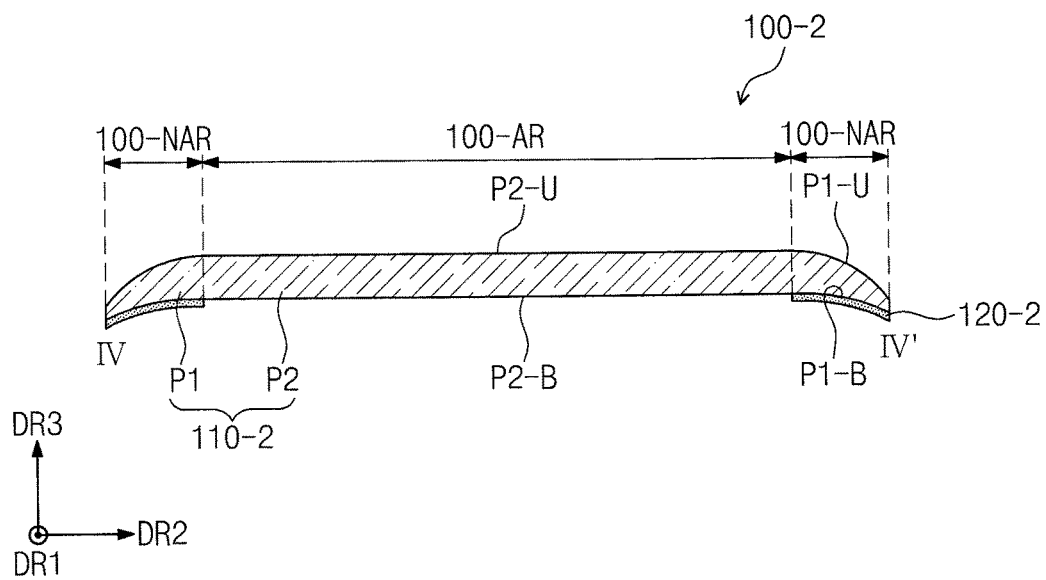
FIG. 9 is a cross-sectional view of the window member taken along the line IV-IV' of FIG. 8.
Figure 10:
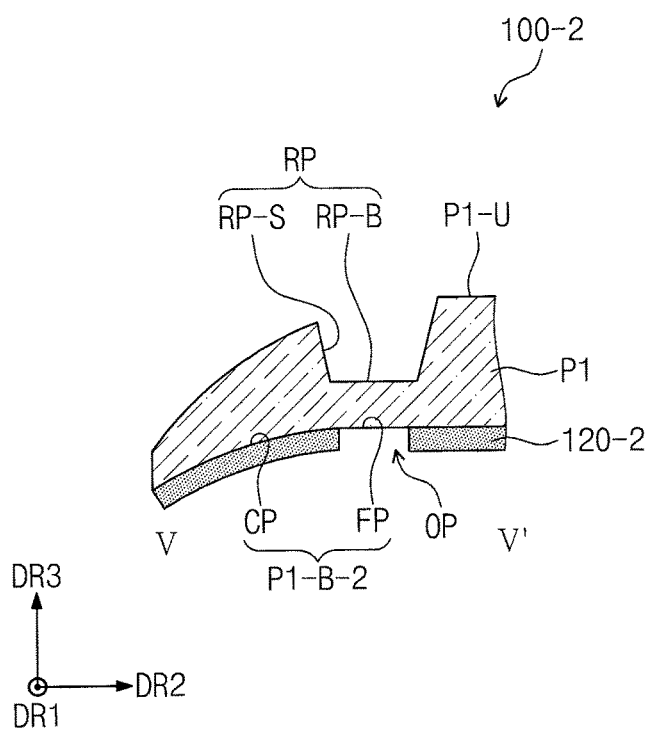
FIG. 10 is a cross-sectional view of the window member taken along the line V-V' of FIG. 8.

FIG. 8 is a perspective view of a window member according to another embodiment of the inventive concept, FIG. 9 is a cross-sectional view of the window member taken along the line IV-IV' of FIG. 8, and FIG. 10 is a cross-sectional view of the window member taken along the line V-V' of FIG. 8.

Referring to FIGS. 8-10, a window member 100-2 (e.g., a window) according to another embodiment of the inventive concept may include a base member 110-2 (e.g., a base) and a printing layer 120-2 (e.g., a printed layer).

The base member 110-2 may include a first part P1 (e.g., a first portion) overlapping the non-transmissive area 100-NAR and a second part P2 (e.g., a second portion) connected to (extending from) the first part P1 to overlap the transmissive area 100-AR. The second part P2 is surrounded by the first part P1 (e.g., the first part P1 surrounds a periphery of the second part P2).

The first part P1 may include a curved first upper surface P1-U and a first lower surface P1-B-2 opposite to the first upper surface P1-U. The first lower surface P1-B-2 may include a flat surface part FP (e.g., a flat surface portion or a flat portion) overlapping the recess part RP and a curved surface part CP (e.g., a curved surface portion or a curved portion) extending from the flat surface part FP. The flat surface part FP may be parallel with a plane defined by a first direction DR1 and a second direction DR2. The curved surface part CP may have a radius of curvature that is greater than that of the first upper surface P1-U. However, embodiments are not limited thereto, and for example, the first part P1 may have a thickness that gradually decreases as the first part P1 extends from (e.g., extends away from) the second part P2.

The second part P2 may include a second upper surface P2-U connected to (extending from) the first upper surface P1-U and a second lower surface P2-B connected to (extending from) the first lower surface P1-B and opposite to the second upper surface P2-U. Each of the second upper surface P2-U and the second lower surface P2-B may be a surface parallel with the plane defined by the first and second directions DR1 and DR2. The second part P2 may have a certain thickness (e.g., a predetermined or constant thickness).

The printing layer 120-2 may be disposed on the first lower surface P1-B-2. A portion of the printing layer 120-2 may be flat on the flat surface part FP of the first lower surface P1-B-2 and the rest of (e.g., the remaining portions of) the printing layer 120-2 may be curved on the curved surface part CP of the first lower surface P1-B-2. The printing layer 120-2 may include an opening portion OP (e.g., an opening or a gap) corresponding to a bottom surface RP-B of the recess part RP. The opening portion OP may have an area that is smaller than that of the bottom surface RP-B of the recess part RP.

Figure 11:
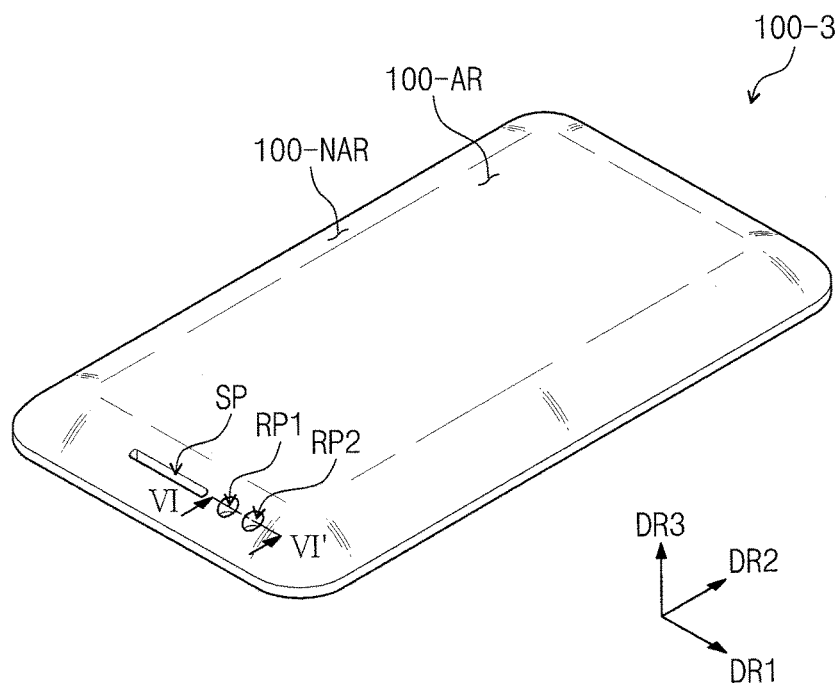
FIG. 11 is a perspective view of a window member according to another embodiment of the inventive concept.
Figure 12:
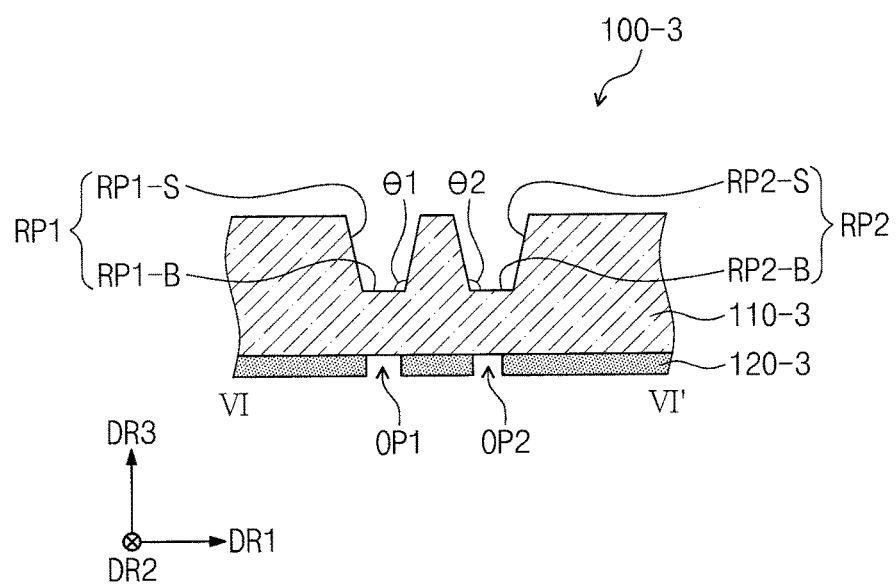
FIG. 12 is a cross-sectional view of the window member taken along the line VI-VI' of FIG. 11.

FIG. 11 is a perspective view of a window member according to another embodiment of the inventive concept, and FIG. 12 is a cross-sectional view of the window member taken along the line VI-VI' of FIG. 11.

Referring to FIGS. 11 and 12, a window member 100-3 (e.g., a window) according to another embodiment of the inventive concept may include a base member 110-3 (e.g., a base) including recess parts (e.g., recesses or grooves) and a printing layer 120-3 (e.g., a printed layer) including opening portions (e.g., openings or gaps). Although two recess parts RP1 and RP2 and two opening portions OP1 and OP2 are exemplarily illustrated in FIG. 11, the number of recess parts and the number of opening portions are not limited thereto.

The base member 110-3 may include a first recess part RP1 and a second recess part RP2. The first and second recess parts RP1 and RP2 may be defined in (e.g., may be defined in a portion of) a non-transmissive area 100-NAR. The first recess part RP1 may be spaced from (e.g., spaced a predetermined distance from) the second recess part RP2.

The first recess part RP1 may include a first bottom surface RP1-B and a first side surface RP1-S. The first bottom surface RP1-B may be flat or substantially flat. The first side surface RP1-S may be inclined from (with respect to) the first bottom surface RP1-B by a first angle $\theta 1$. The first angle $\theta 1$ may be in a range of greater than about 0° to less than about 180°.

The second recess part RP2 may include a second bottom surface RP2-B and a second side surface RP2-B. The second bottom surface RP2-B may be flat or substantially flat. The second side surface RP2-S may be inclined from the second bottom surface RP2-B by a second angle $\theta 2$. The second angle $\theta 2$ may be in a range of greater than about 0° to less than about 180°. Although the first angle $\theta 1$ is illustrated as being equal to the second angle $\theta 2$ in FIG. 12, embodiments are not limited thereto. For example, the first angle $\theta 1$ and the second angle $\theta 2$ may be different from each other.

The printing layer 120-3 includes a first opening portion OP1 corresponding to the first recess part RP1 and a second opening portion OP2 corresponding to the second recess part RP2.

The first recess part RP1 may overlap the first opening portion OP1, and the second recess part RP2 may overlap the second opening portion OP2. In a plan view, the first opening portion OP1 may be defined at the first bottom surface RP1-B, and the second opening portion OP2 may be defined at the second bottom surface RP2-B. The first bottom surface RP1-B may have an area that is greater than or equal to that of the first opening portion OP1. The second bottom surface RP2-B may have an area that is greater than or equal to that of the second opening portion OP2.

The display apparatus according to embodiments of the inventive concept may include the window member including the recess part to prevent or reduce occurrences of the light sensor malfunctioning.

The above-described embodiments are to be considered illustrative and not restrictive, and the appended claims are intended to cover all such modifications, enhancements, equivalents, and other embodiments which fall within the spirit and scope of the inventive concept. Thus, to the maximum extent allowed by law, the scope of the inventive concept is to be determined by the broadest permissible interpretation of the following claims and their equivalents and shall not be restricted or limited by the foregoing detailed description.

What is claimed is:

1. A display apparatus comprising:
a display panel configured to display an image;
a window on the display panel, the window having a transmissive area through which the image is transmitted and a non-transmissive area adjacent to the transmissive area, the window comprising a base member and a printed layer, the base member having a first portion at the non-transmissive area and a second portion at the transmissive area and extending from the first portion, the first portion having a curved upper surface and a recess;
a case configured to accommodate the display panel, the case being coupled to the window; and
a light sensor accommodated in the case overlapping the non-transmissive area,
wherein the printed layer is on a lower surface of the first portion and has an opening corresponding to the light sensor, and
wherein the recess has a flat bottom surface recessed from the upper surface of the first portion and overlapping the light sensor.

2. The display apparatus of claim 1, wherein the recess has a side surface extending between the bottom surface and the upper surface of the first portion, and
wherein the side surface is inclined with respect to the bottom surface by an angle.

3. The display apparatus of claim 2, wherein the angle is in a range of greater than about 0° to less than about 180°.

4. The display apparatus of claim 2, wherein a length of a portion of the side surface nearer to the second portion from the bottom surface to the upper surface of the first portion is greater than a length of another portion of the side surface farther from the second portion from the bottom surface to the upper surface of the first portion.

5. The display apparatus of claim 2, wherein the lower surface is flat.

6. The display apparatus of claim 5, wherein a portion of the base member between the bottom surface of the recess and the lower surface of the first portion has a uniform thickness.

7. The display apparatus of claim 6, wherein the bottom surface has an area that is greater than that of the opening.

8. The display apparatus of claim 2, wherein the lower surface of the first portion has a flat surface portion overlapping the light sensor and a curved surface portion extending from the flat surface portion.

9. The display apparatus of claim 1, wherein the base member comprises glass or plastic.

10. The display apparatus of claim 1, wherein the light sensor comprises:
a light generator configured to generate light; and
a light receiver configured to receive the light generated by the light generator.

11. The display apparatus of claim 10, wherein the light is infrared light.

12. The display apparatus of claim 1, wherein the printed layer has a plurality of the openings, and
wherein adjacent ones of the openings are spaced from each other.

13. A window comprising:
a base member comprising:
a first portion configured to block light, the first portion having a curved upper surface and a recess, the recess having a flat bottom surface recessed from the upper surface of the first portion; and
a second portion configured to transmit light and extending from the first portion; and
a printed layer on a lower surface opposite the upper surface of the first portion, the printed layer having an opening,
wherein the recess overlaps the opening.

14. The window of claim 13, wherein the recess has a side surface extending between the bottom surface and the upper surface of the first portion, and
wherein the side surface is inclined with respect to the bottom surface by an angle.

15. The window of claim 14, wherein a portion of the base member between the bottom surface of the recess and the lower surface of the first portion has a uniform thickness.

16. The window of claim 14, wherein the printed layer has a plurality of the openings, and
wherein the openings are spaced from each other.

17. The window of claim 16, wherein the bottom surface of the recess has an area that is greater than a sum of areas of the openings.

18. The window of claim 16, wherein the base member has a plurality of the recesses, and
wherein ones of the recesses respectively correspond to ones of the openings.

19. The window of claim 18, wherein a bottom surface of each of the recesses has an area that is greater than that of each of the openings.

20. The window of claim 18, wherein a bottom surface of each of the recesses has an area that is greater than that of corresponding ones of the openings.

* * * * *